(12) United States Patent
Chen et al.

(10) Patent No.: US 10,331,250 B2
(45) Date of Patent: Jun. 25, 2019

(54) TOUCH PANELS AND TOUCH DISPLAY DEVICES

(71) Applicant: InnoLux Corporation, Miao-Li County (TW)

(72) Inventors: Wei-Chih Chen, Miao-Li County (TW); Tung-Chang Tsai, Miao-Li County (TW); Hung-Sheng Cho, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 270 days.

(21) Appl. No.: 15/450,435

(22) Filed: Mar. 6, 2017

(65) Prior Publication Data

US 2017/0277314 A1   Sep. 28, 2017

(30) Foreign Application Priority Data

Mar. 23, 2016   (CN) .......................... 2016 1 0168080

(51) Int. Cl.
*G06F 3/041*   (2006.01)
*G06F 3/044*   (2006.01)
(Continued)

(52) U.S. Cl.
CPC ........ *G06F 3/0412* (2013.01); *G02F 1/13338* (2013.01); *G06F 3/044* (2013.01);
(Continued)

(58) Field of Classification Search
CPC ....... G02F 1/13338; G06F 2203/04107; G06F 2203/04803; G06F 3/0412; G06F 3/0416; G06F 3/044; H01L 27/323
See application file for complete search history.

(56) References Cited

U.S. PATENT DOCUMENTS 8,704,788 B2   4/2014 Nam et al.
9,853,092 B2   12/2017 Lee et al.
(Continued)

FOREIGN PATENT DOCUMENTS

CN   102339184 A   2/2012
CN   103855188 A   6/2014

OTHER PUBLICATIONS

Chinese language Office Action dated Apr. 4, 2019, issued in application No. CN 201610168080.0.

*Primary Examiner* — Insa Sadio
(74) *Attorney, Agent, or Firm* — McClure, Qualey & Rodack, LLP

(57) ABSTRACT

A touch panel is provided. The touch panel includes a substrate having a touch area and a peripheral area adjacent to the touch area. A transparent conductive layer is disposed on the substrate, the transparent conductive layer includes a touch-sensing portion and a wiring portion, wherein the touch-sensing portion is electrically connected to the wiring portion, and wherein the touch-sensing portion is disposed corresponding to the touch area and the wiring portion is disposed corresponding to the peripheral area. A metal layer is disposed on the wiring portion of the transparent conductive layer and corresponding to the peripheral area. An insulating layer is disposed on the metal layer and corresponding to the peripheral area. A touch display device including the touch panel is also provided.

20 Claims, 13 Drawing Sheets

(51) Int. Cl.
*H01L 27/32* (2006.01)
*G02F 1/1333* (2006.01)

(52) U.S. Cl.
CPC .......... *G06F 3/0416* (2013.01); *H01L 27/323* (2013.01); *G06F 2203/04107* (2013.01); *G06F 2203/04803* (2013.01)

(56) References Cited

U.S. PATENT DOCUMENTS

2013/0181921 A1* 7/2013 Kuwajima ............... G06F 3/041
  345/173
2014/0168529 A1* 6/2014 Lin ..................... G02F 1/13452
  349/12

* cited by examiner

TOUCH PANELS AND TOUCH DISPLAY DEVICES

CROSS REFERENCE TO RELATED APPLICATIONS

This Application claims priority of China Patent Application No. 201610168080.0, filed on Mar. 23, 2016, the entirety of which is incorporated by reference herein.

BACKGROUND

Field of the Disclosure

The present disclosure relates to touch panels and touch display devices on which the touch panels are applied.

Description of the Related Art

Touch panels have been widely used in a variety of areas, including household electrical appliances, communication devices, and electronic information devices. At present, a touch panel can be combined with a display panel to form a touch display apparatus, which allows users to directly select pictures shown on the panel using a finger or a touch pen. Therefore, touch display apparatuses can gradually replace tangible input devices such as keyboards to serve as the input interface for various electronic products, and provide an efficient system for operating these products.

Project capacitive touch technology is, at present, a mainstream of touch panels, wherein a multi-touch mode is the focus of development for various touch panel manufacturers. A touch panel supporting the multi-touch mode is generally a double-layer stacked configuration or a single-layer configuration, wherein each layer includes a plurality of driving electrodes (Tx) and a plurality of sensing electrodes (Rx).

BRIEF SUMMARY

In some embodiments of the disclosure, a touch panel is provided. The touch panel includes a substrate having a touch area and a peripheral area adjacent to the touch area. A transparent conductive layer is disposed on the substrate. The transparent conductive layer includes a touch-sensing portion and a wiring portion, wherein the touch-sensing portion is electrically connected to the wiring portion, and wherein the touch-sensing portion is disposed corresponding to the touch area and the wiring portion is disposed corresponding to the peripheral area. A metal layer is disposed on the wiring portion of the transparent conductive layer and corresponding to the peripheral area. A photoresist layer is disposed in the peripheral area of the substrate and covers the wiring layer. An insulating layer is disposed on the metal layer and corresponding to the peripheral area. In some embodiments of the disclosure, a touch display device is provided. The touch display device includes a thin-film transistor substrate and a display medium layer disposed on the thin-film transistor substrate. A substrate is disposed on the display medium layer and having a touch area and a peripheral area adjacent to the touch area. A transparent conductive layer is disposed on the substrate. The transparent conductive layer includes a touch-sensing portion and a wiring portion, wherein the touch-sensing portion is electrically connected to the wiring portion, and wherein the touch-sensing portion is disposed corresponding to the touch area and the wiring portion is disposed corresponding to the peripheral area. A metal layer is disposed on the wiring portion of the transparent conductive layer and corresponding to the peripheral area. An insulating layer is disposed on the metal layer and corresponding to the peripheral area. A detailed description is given in the following embodiments with reference to the accompanying drawings.

BRIEF DESCRIPTION OF THE DRAWINGS

The present disclosure can be more fully understood by reading the subsequent detailed description and examples with references made to the accompanying drawings, wherein.

DETAILED DESCRIPTION OF THE DISCLOSURE

Figure 1:
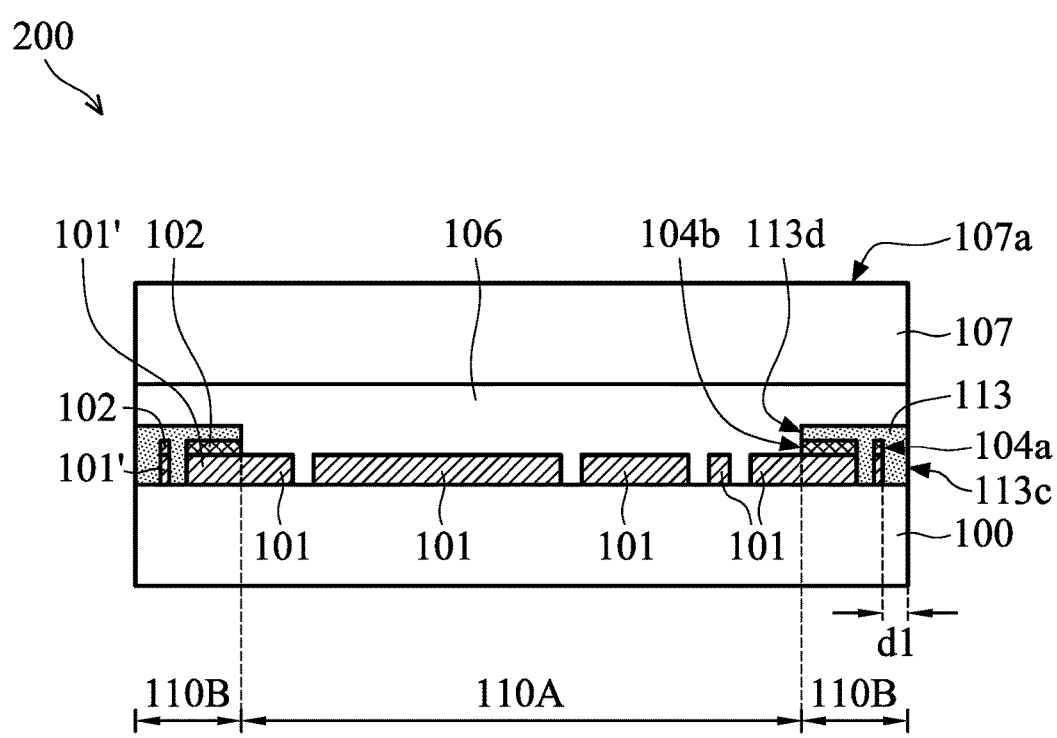
FIG. 1 shows a cross section of a touch panel, along line A-A' shown in FIG. 2J, according to some embodiments of the disclosure.

The following description is of a mode for carrying out the disclosure. This description is made for the purpose of illustrating the general principles of the disclosure and should not be taken in a limiting sense. The scope of the disclosure is best determined by reference to the appended claims. Moreover, the same or similar elements in the drawings and the description are labeled with the same reference numbers. Furthermore. features in different embodiments of the following description can be combined, replaced or mixed with one another to constitute another embodiment.

In the embodiments of the disclosure, a structure (a layer, an element, a substrate) disposed on another structure (a layer, an element, a substrate) can mean that two structures are adjacent to each other and are in direct contact with each other. It can also mean that at least one interposed structure (an interposed layer, an interposed element, an interposed substrate, an interposed spacer) between two structures, and the lower surface of a structure is adjacent to or directly connected with the upper surface of the interposed structure, and the upper surface of another structure is adjacent to or directly connected with the lower surface of the interposed structure.

FIGS. 2A-2J show plane views of various stages of a method of fabricating a touch panel 200 according to some embodiments of the disclosure. FIG. 1 shows a cross section of the touch panel 200, along line A-A' shown in FIG. 2J, according to some embodiments of the disclosure. The touch panel 200 includes a substrate 100. As shown in FIG. 1, the substrate 100 has a touch area 110A and a peripheral area 110B adjacent to the touch area 110A. In some embodiments, the material of the substrate 100 may include glass, polyethylene terephthalate (PET), polyimide (PI), or another flexible material. In some embodiment, the shape of the substrate 100 is not limited and may include circle, ellipse, polygon, or non-regular.

The touch panel 200 includes a transparent conductive layer. The transparent conductive layer is disposed on the substrate 100, and the transparent conductive layer includes a touch-sensing portion 101 and a wiring portion 101'. The touch-sensing portion 101 is electrically connected to the wiring portion 101'. The touch-sensing portion 101 is disposed corresponding to the touch area 110A, and the wiring portion 101' is disposed corresponding to the peripheral area 110B.

The touch panel 200 further includes a metal layer 102 disposed on the wiring portion 101' of the transparent conductive layer and corresponding to the peripheral area 110B. The metal layer 102 is electrically connected to the transparent conductive layer. The metal layer 102 includes a first sidewall 104a that is away from the touch area 110A and a third sidewall 104b that is near the touch area 110A. In some embodiments, the metal layer 102 and the wiring portion 101' includes a plurality of wires (not shown). FIG. 1 merely shows two wires located in the peripheral area 110B at two sides of the touch panel 200 as an example for illustration, but it is not limited thereto. In some embodiments, the ratio of the thickness of the wiring portion 101' to the thickness of the metal layer 102 is between about 1:5 to 1:10. In the embodiment, the touch-sensing portion 101 and the wiring portion 101' of the transparent conductive layer have the same thickness and may be formed by the same layer of a transparent conductive material.

In some embodiments, the transparent conductive layer may include a transparent conductive material such as indium tin oxide (ITO), indium zinc oxide (IZO), indium zinc tin oxide (IZTO), fluorine doped tin oxide (FTO), aluminum doped zinc oxide (AZO), gallium doped zinc oxide (GZO), indium gallium zinc oxide (IGZO) or another suitable transparent conductive material. In the embodiment, the material of the touch-sensing portion 101 of the transparent conductive layer is the same as that of the wiring portion 101' of the transparent conductive layer. In some embodiments, the material of the metal layer 102 may include copper, aluminum, silver, gold, molybdenum or another suitable conductive material.

The metal layer 102 is disposed on the wiring portion 101' of the transparent conductive layer. Therefore, even though the metal layer 102 can easily become oxidized, the wiring portion 101' disposed under the metal layer 102 still has a conductive function. Thus, the design of the configuration of the metal layer 102 and the wiring portion 101' can effectively reduce the risk of conductive function failure.

In the embodiment, the touch panel 200 further includes an insulating layer 113. The insulating layer 113 is disposed on the metal layer 102 and corresponding to the peripheral area 110B. The insulating layer 113 covers a top surface and the first sidewall 104a of the metal layer 102 and the wiring portion 101'. Moreover, the insulating layer 113 has a light-shielding effect. Thus, the insulating layer 113 defines the peripheral area 110B of the touch panel 200, i.e., the insulating layer 113 is aligned with the peripheral area 110B. The insulating layer 113 includes a second sidewall 113c that is away from the touch area 110A and a fourth sidewall 113d that is near the touch area 110A. There is a first distance $d_1$ between the first sidewall 104a of the metal layer 102 and the second sidewall 113c of the insulating layer 113. In addition, the third sidewall 104b of the metal layer 102 is substantially aligned with the fourth sidewall 113d of the insulating layer 113. In some embodiments, the first distance $d_1$ is about 100 μm to 200 μm. In some embodiments, the first distance $d_1$ is about 150 μm to 200 μm. In some embodiments, the first distance $d_1$ is about 150 μm to 180 μm. In some embodiments, the metal layer 102 and the wiring portion 101' includes a plurality of wires (not shown), and the insulating layer 113 fills gaps between the plurality of wires. In the embodiment, the insulating layer 113 is a dark color (for example, black or blue) dry film photoresist. The material of the dry film photoresist includes linkers, photo-reactive monomers, photo-initiators, color-changing agent and adhesion promoters. In some embodiments, the insulating layer 113 includes an opaque photoresist material. In some embodiments, the insulating layer 113 includes a photoresist material and an optical density of the insulating layer 113 is 1.5 to 3.

Through the insulating layer 113 covering the top surface and the first sidewall 104a of the metal layer 102 and covering the wiring portion 101', the insulating layer 113 can effectively protect the metal layer 102 and the wiring portion 101' in the manufacturing processes of the touch panel 200. The insulating layer 113 avoids physical and chemical destructions of the metal layer 102 and the wiring portion 101' in the manufacturing processes of the touch panel 200, and the yield of the touch panel 200 is thereby enhanced.

In some embodiments, the touch panel 200 further includes a protective layer 106 (as shown in FIG. 1). The protective layer 106 is disposed on the insulating layer 113 and covers the touch area 110A and the peripheral area 110B. In some embodiments, the material of the protective layer 106 may include an optical clear adhesive (OCA), an optical clear resin (OCR) or another suitable transparent protective material.

Figure 2A:
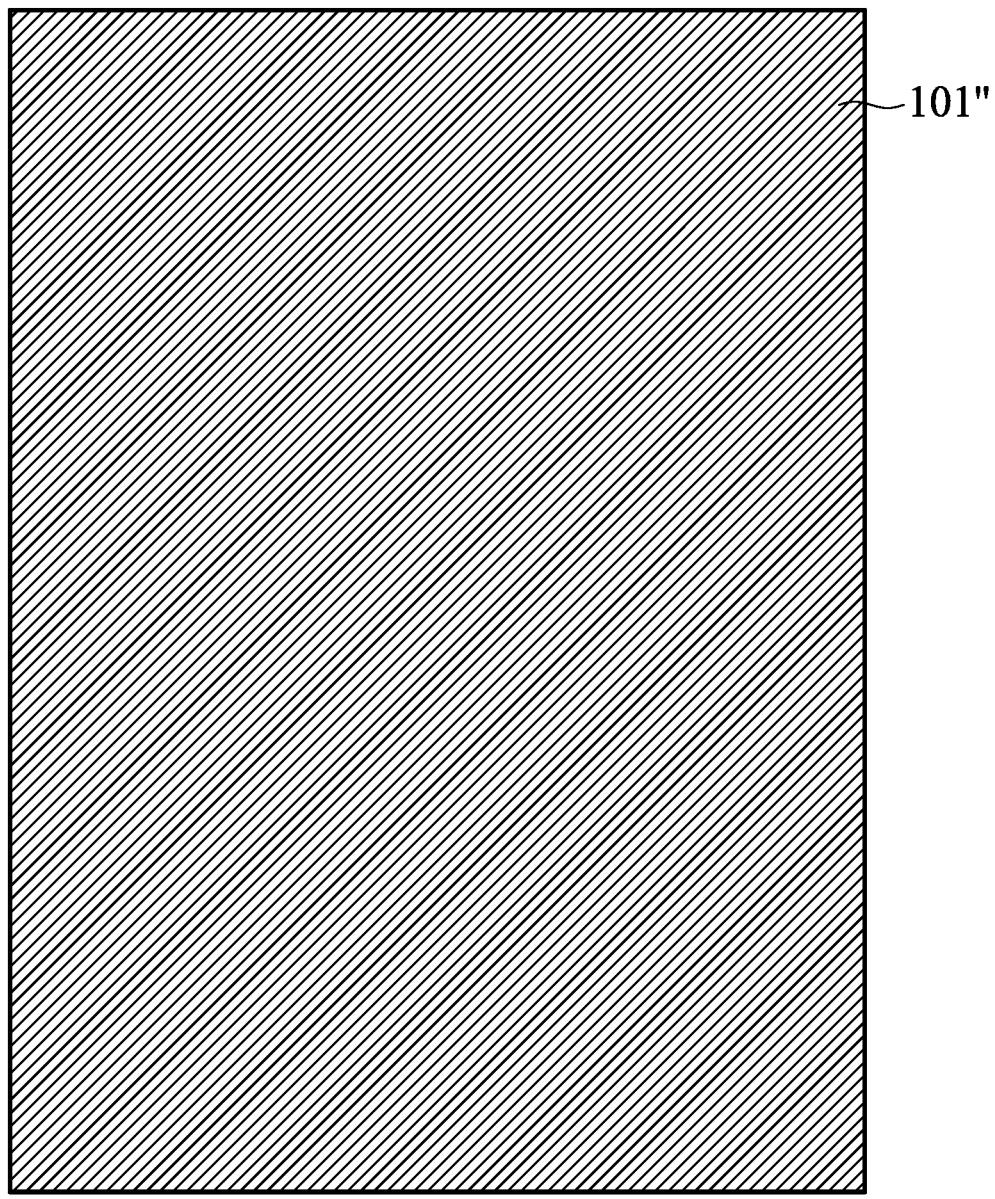
FIGS. 2A-2J show plane views of various stages of a method of fabricating a touch panel according to some embodiments of the disclosure.
Figure 2B:
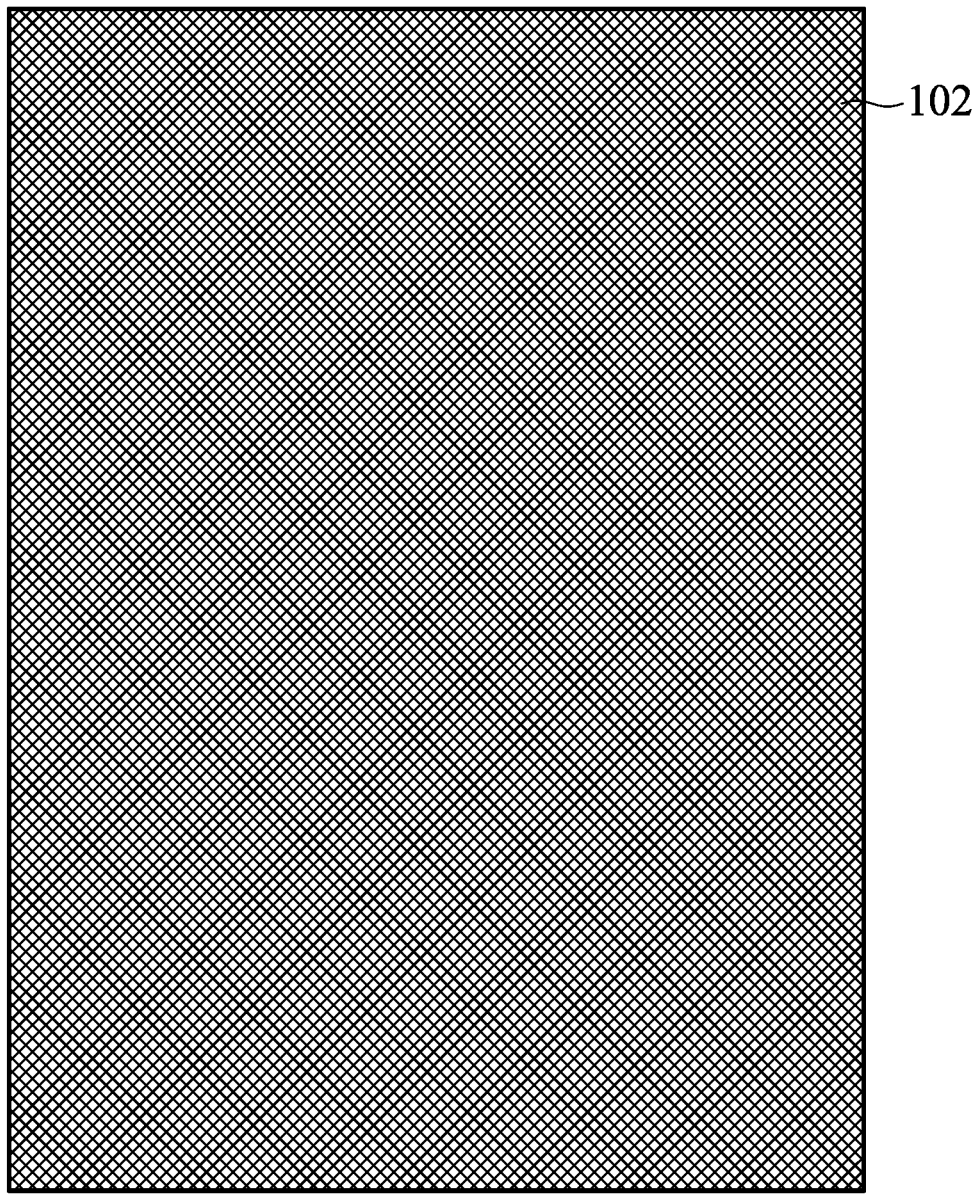
Figure 2C:
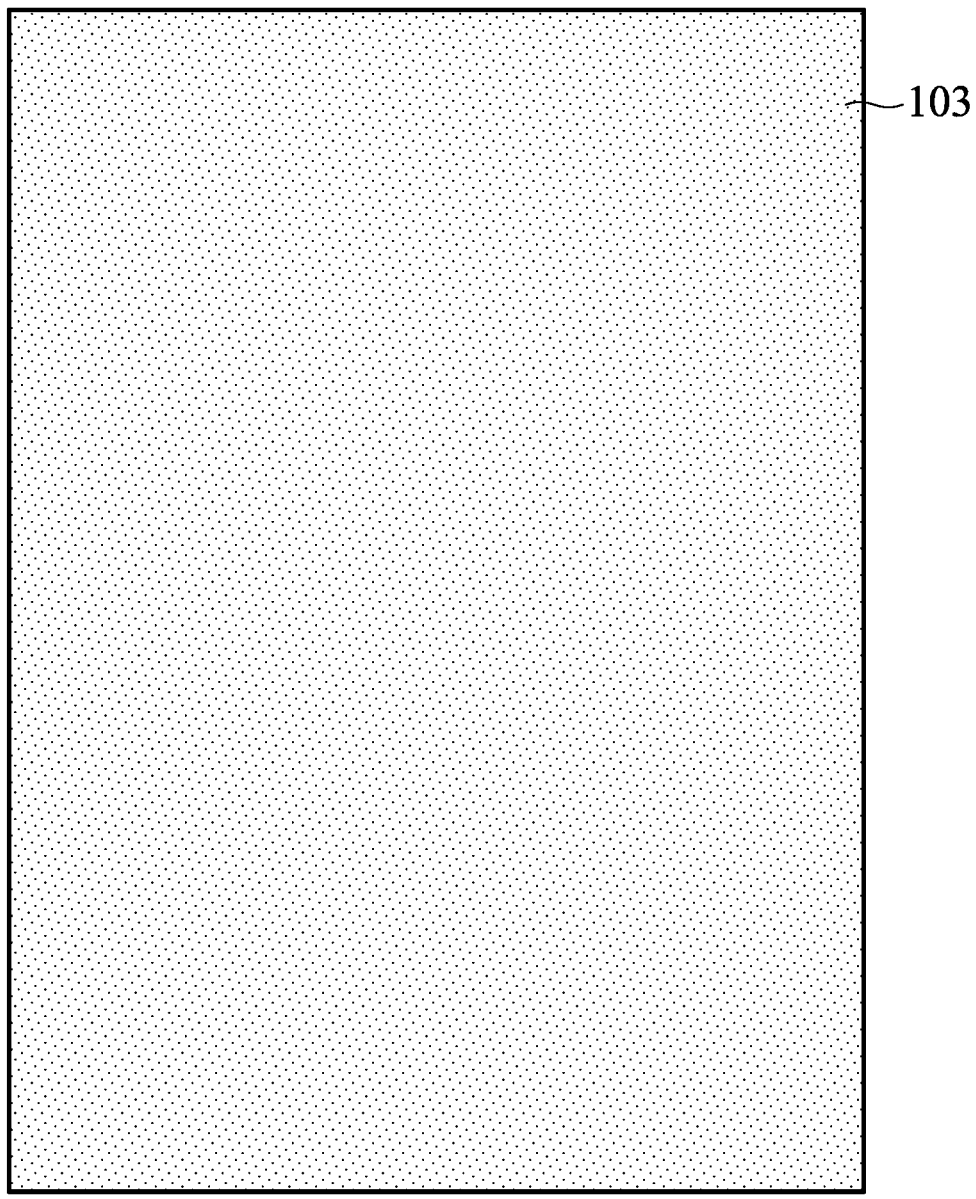
Figure 2D:
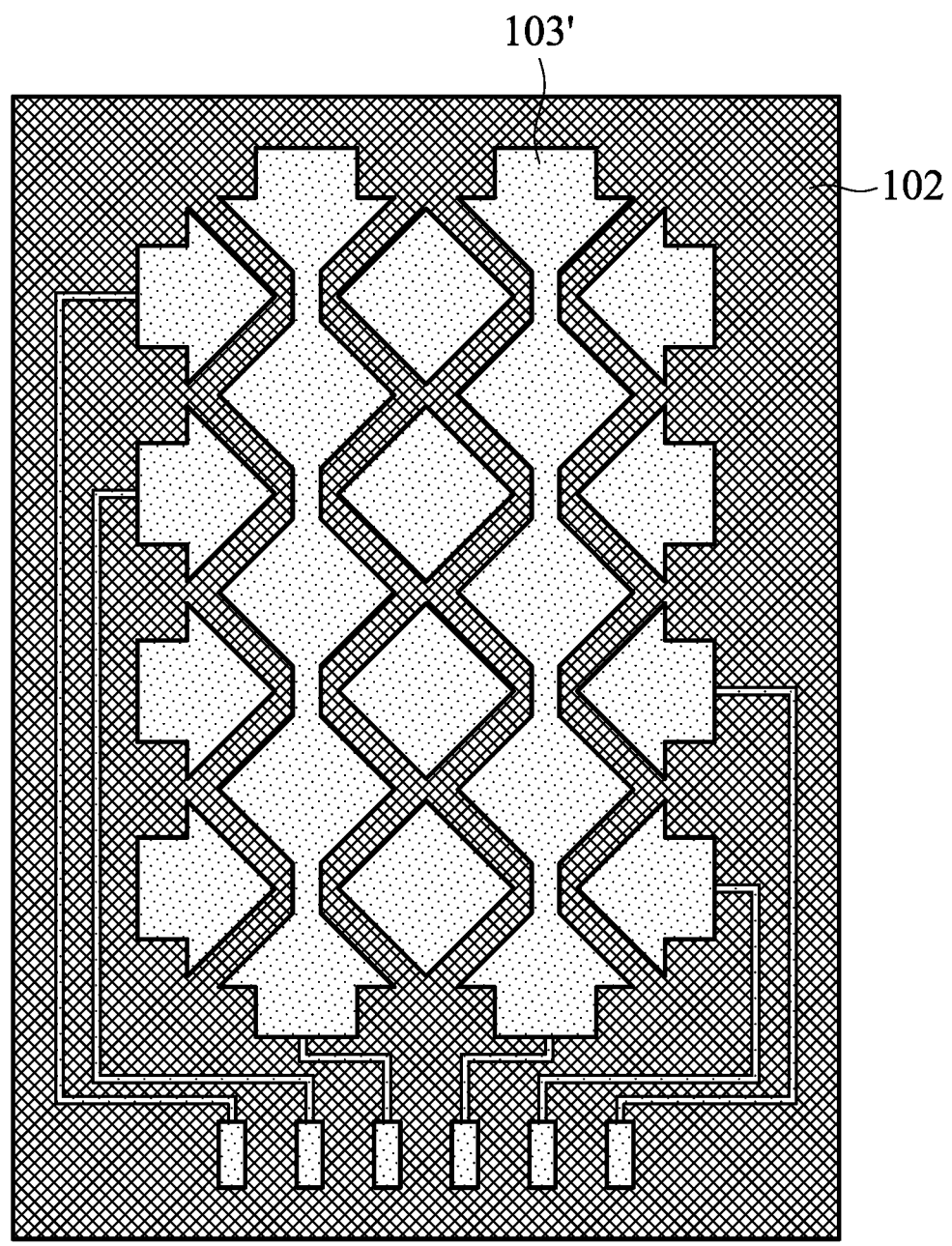
Figure 2E:
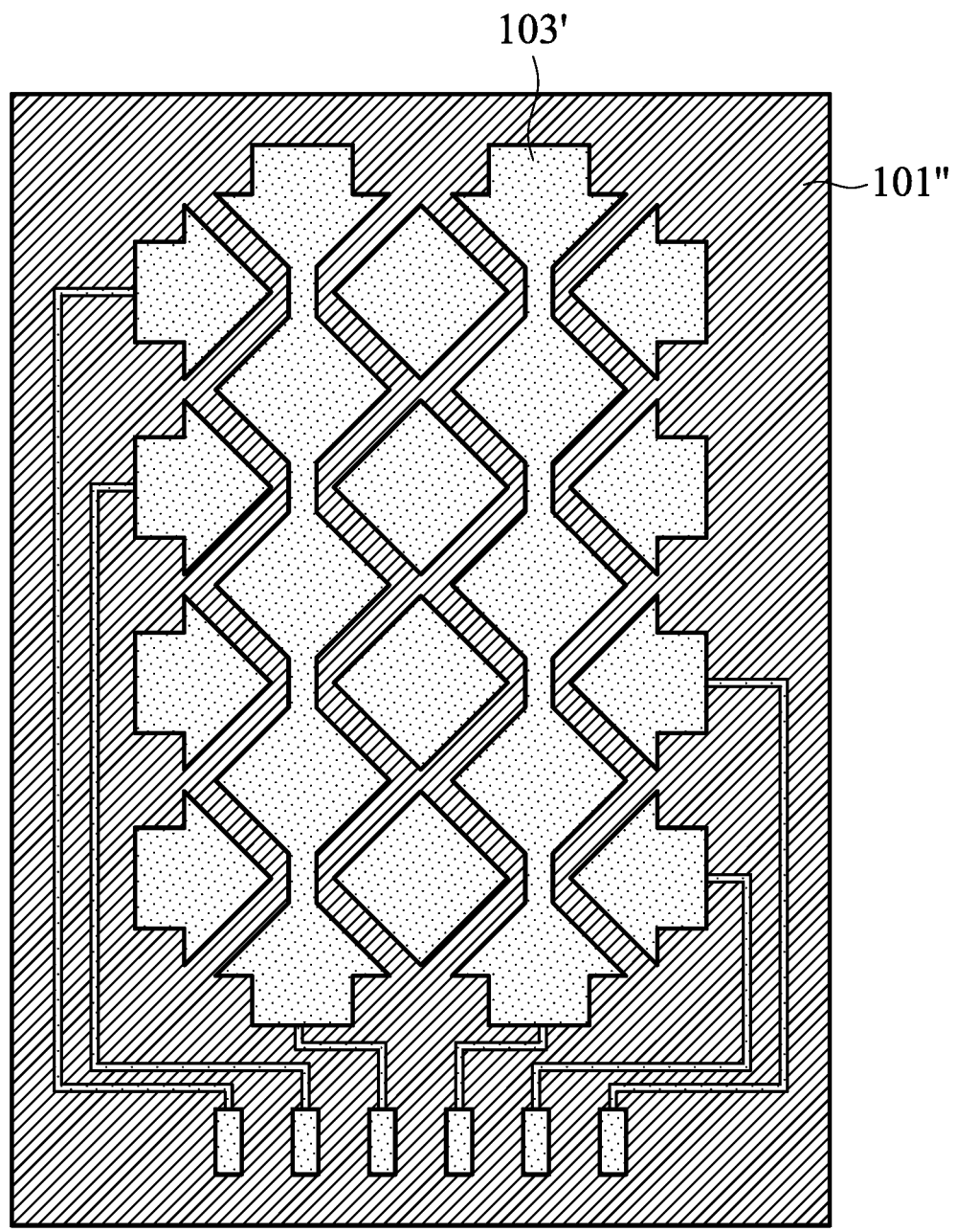
Figure 2F:
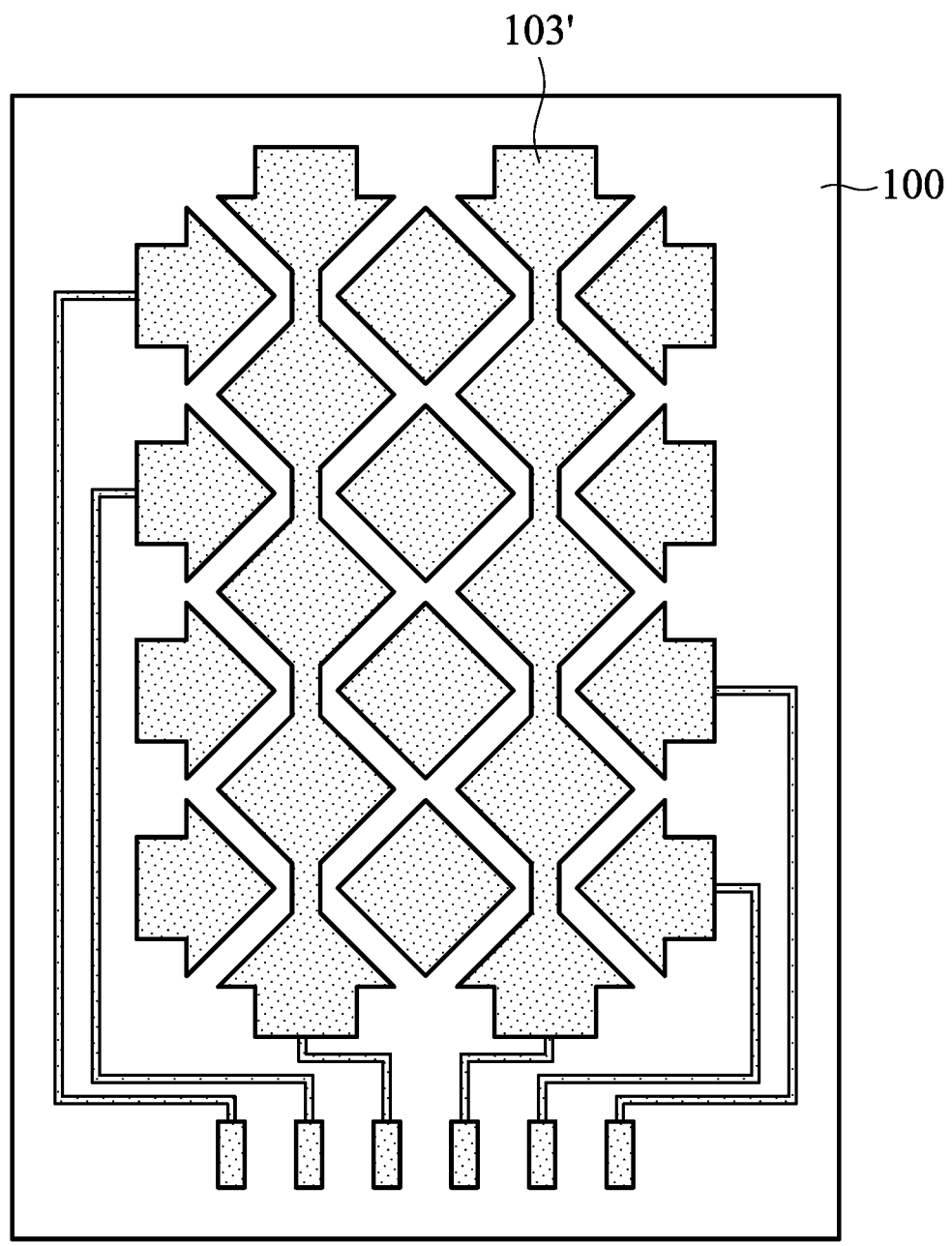
Figure 2G:
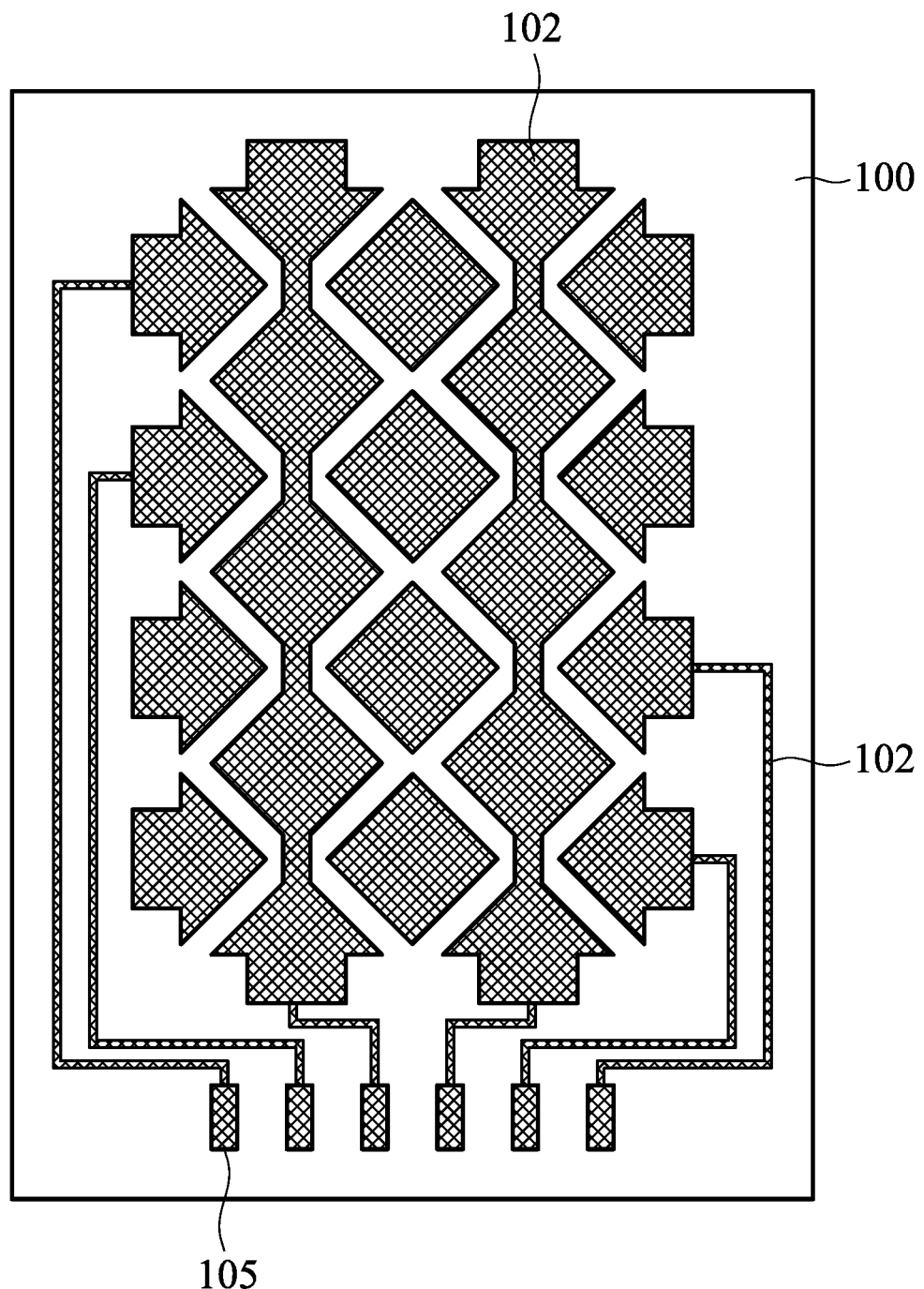
Figure 2H:
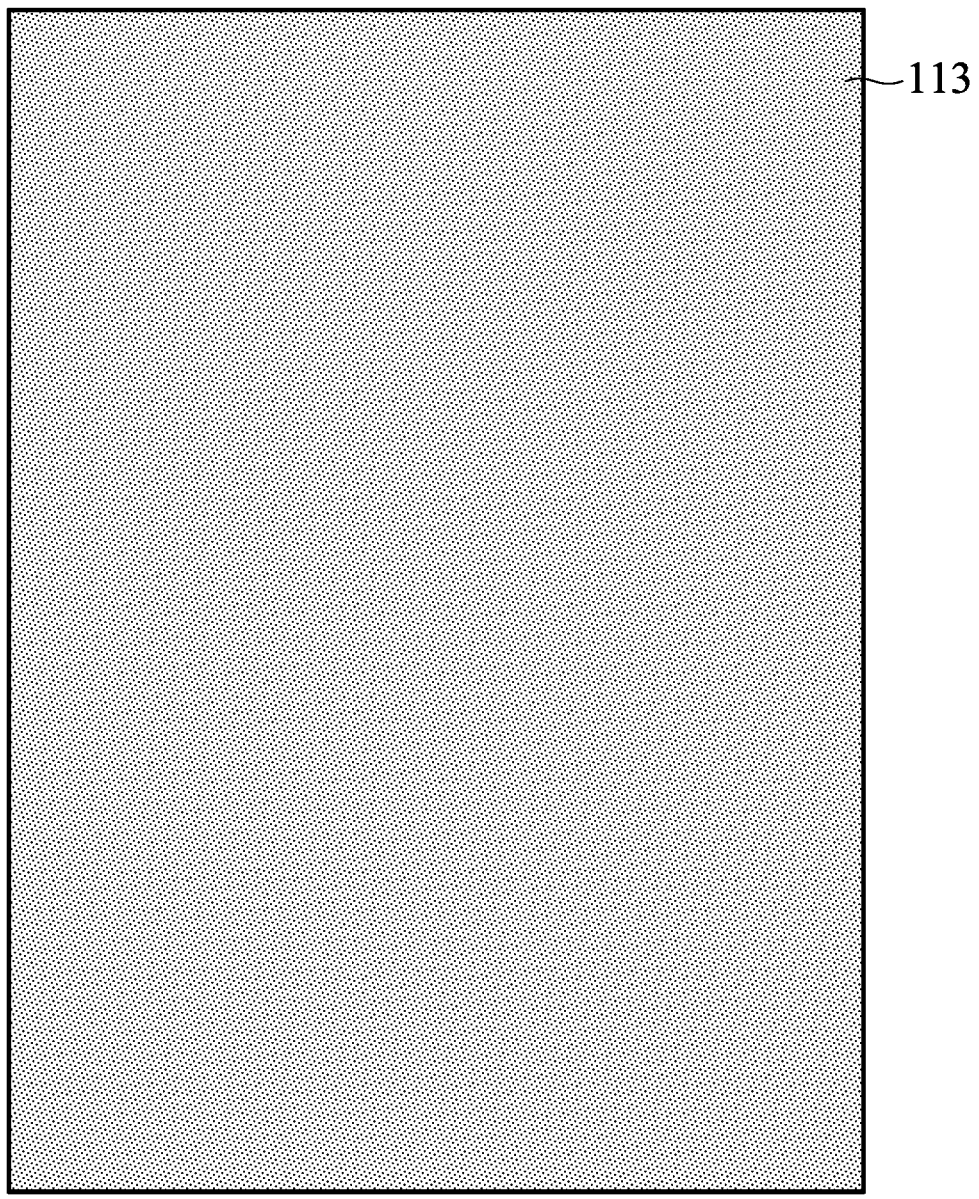
Figure 2I:
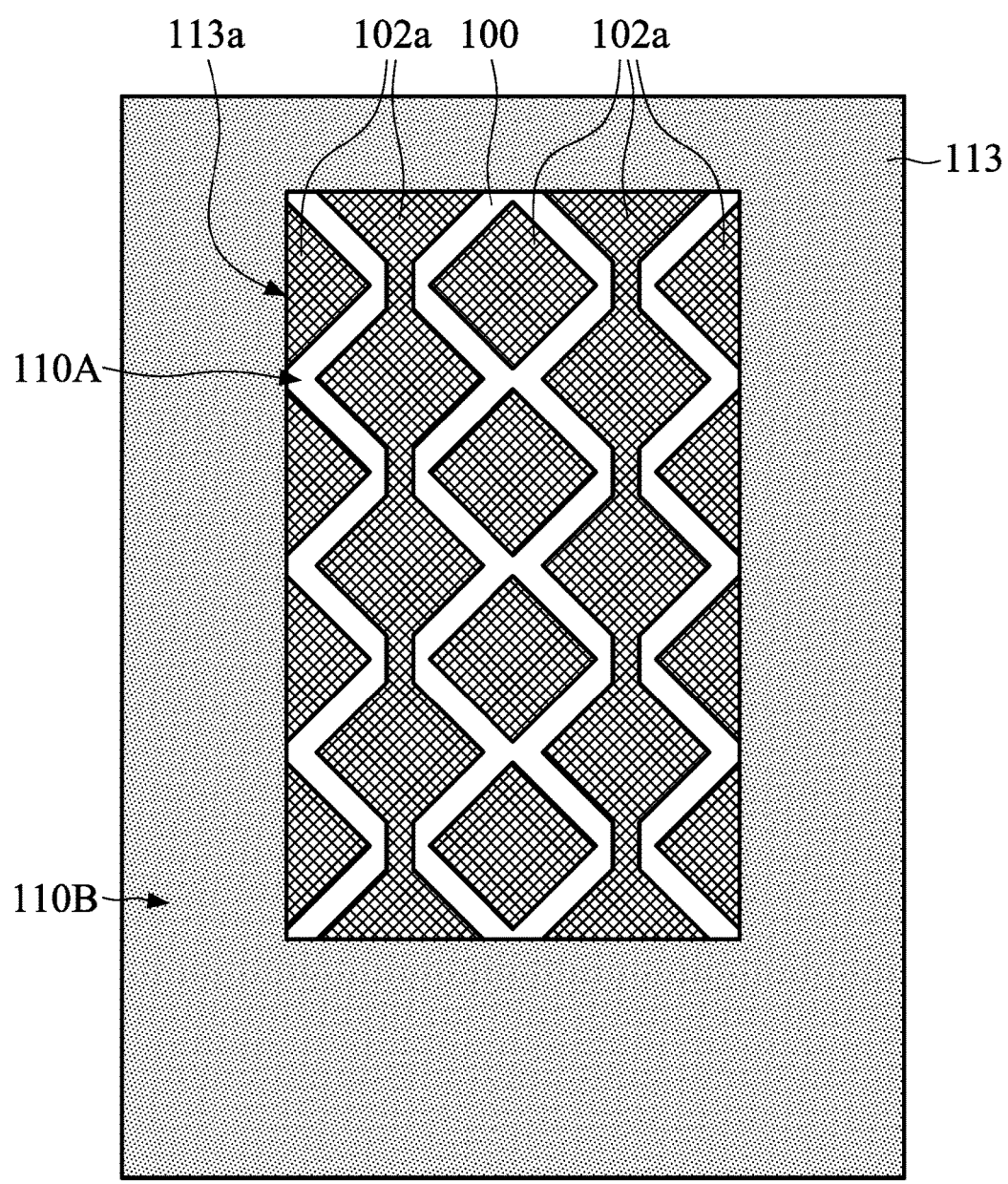
Figure 2J:
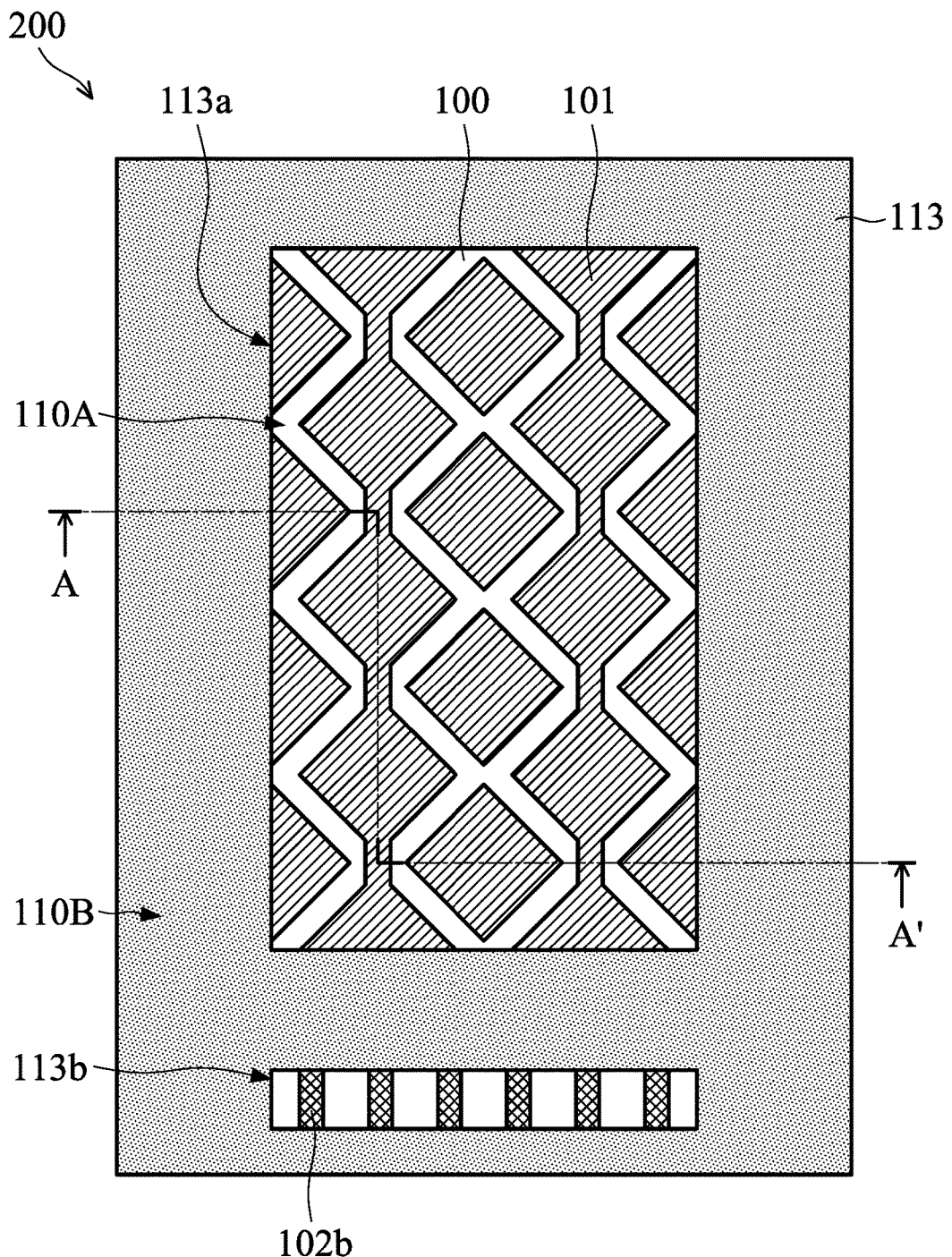

In the embodiment, the touch panel 200 further includes a cover plate 107 (shown in FIG. 1 and not shown in FIG. 2J). The cover plate 107 is disposed on the protective layer 106. The outer surface of the cover plate 107 can be used as a touch surface 107a the touch panel 200. In some embodiments, the material of the cover plate 107 may include plastic, glass or another suitable light-transmitting material.

The embodiments of the disclosure use the insulating layer 113 to directly or indirectly cover the top surface and the first sidewall 104a of the metal layer 102 and the wiring portion 101', and the third sidewall 104b of the metal layer 102 can be substantially aligned with the fourth sidewall 113d of the insulating layer 113. As a result, the distance between the fourth sidewall 113d of the insulating layer 113 and the innermost wire of the metal layer 102 and the wiring portion 101' is decreased to about zero, and the peripheral area 110B of the touch panel 200 defined by the insulating layer 113 having the light-shielding effect is thereby reduced. Therefore, the slim border design of the touch panel 200 is achieved.

The embodiments of the disclosure use the insulating layer 113 to directly or indirectly cover the metal layer 102 and cover the wiring portion 101'. As a result, the insulating layer 113 can be more effective in preventing moisture penetration and protecting the metal layer 102 and the wiring portion 101' of the touch panel 200. Therefore, the touch panel 200 can pass a strict reliability test (the reliability test includes two tests in temperature and humidity), and the lifetime of the touch panel 200 is increased. Accordingly, in the designs of the touch panel 200, the first distance $d_1$ of the wiring layer 104 which is between the first sidewall 104a away from the touch area 110A and the second sidewall 113c of the insulating layer 113 which is away from the touch area 110A can be effectively decreased to achieve a slim border design for the touch panel 200.

Moreover, according to embodiments of the disclosure, the insulating layer 113 covers the top surface and the first sidewall 104a of the metal layer 102 and covers the wiring portion 101'. Because the insulating layer 113 has a light-shielding effect, the touch panel 200 may not need to form an additional light-shielding layer on the cover plate 107. Therefore, the thickness of the protective layer 106 disposed between the cover plate 107 and the substrate 100 can be effectively reduced, and the total thickness of the touch panel 200 is thereby reduced, and the touch panel can be designed to be lightweight or thin. In some embodiments, the thickness of the protective layer 106 is about 10 μm to 100 μm. In some embodiments, the thickness of the protective layer 106 is about 30 μm to 80 μm. In some embodiments, the thickness of the protective layer 106 is about 40 μm to 60 μm.

Figure 3:
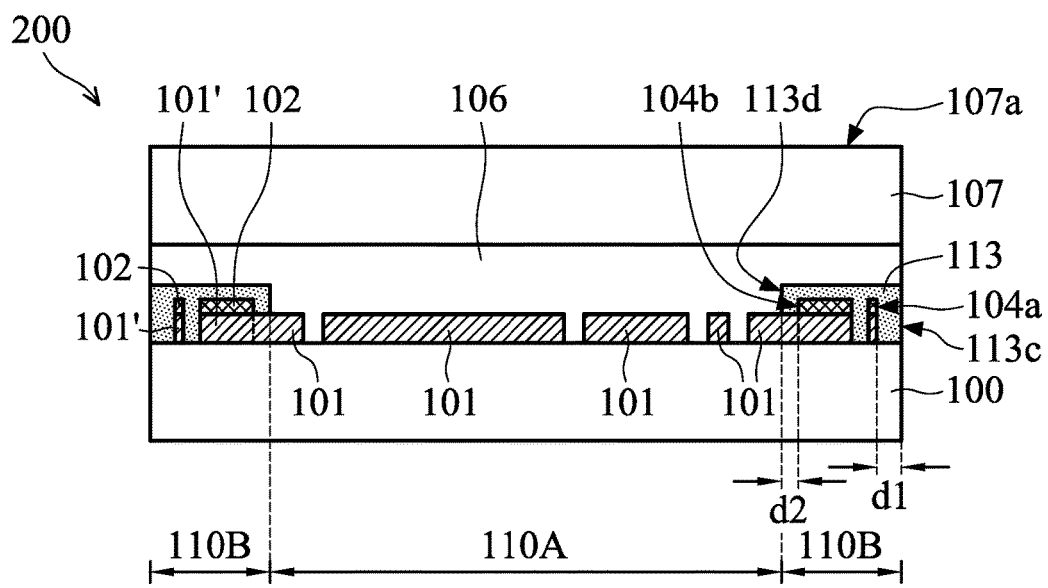
FIG. 3 shows a cross section of a touch panel, along line A-A' shown in FIG. 2J, according to some other embodiments of the disclosure.

FIG. 3 shows a cross section of a touch panel 200, along line A-A' shown in FIG. 2J, according to some other embodiments of the disclosure. Elements of the touch panel 200 in FIG. 3 that are the same as those in FIG. 1 are labeled with the same reference numbers as in FIG. 1 and are not described again for brevity.

The structure of the touch panel 200 shown in FIG. 3 is similar to that of the touch panel 200 shown in FIG. 1. The difference therebetween is that the insulating layer 113 of the touch panel 200 in FIG. 3 further covers the third sidewall 104b of the metal layer 102 which is near the touch area 110A such that there is a second distance $d_2$ between the third sidewall 104b of the metal layer 102 and the fourth sidewall 113d of the insulating layer 113 which is near the touch area 110A. Since the insulating layer 113 has a light-shielding effect, the width of the peripheral area 110B defined by the insulating layer 113 is increased by the second distance $d_2$. In the embodiment, the first distance $d_1$ is greater than the second distance $d_2$. In some embodiments, the second distance $d_2$ is about 0 μm to 10 μm. In some embodiments, the second distance $d_2$ is about 0.1 μm to 6 μm. In some embodiments, the second distance $d_2$ is about 0.1 μm to 3 μm.

Figure 4:
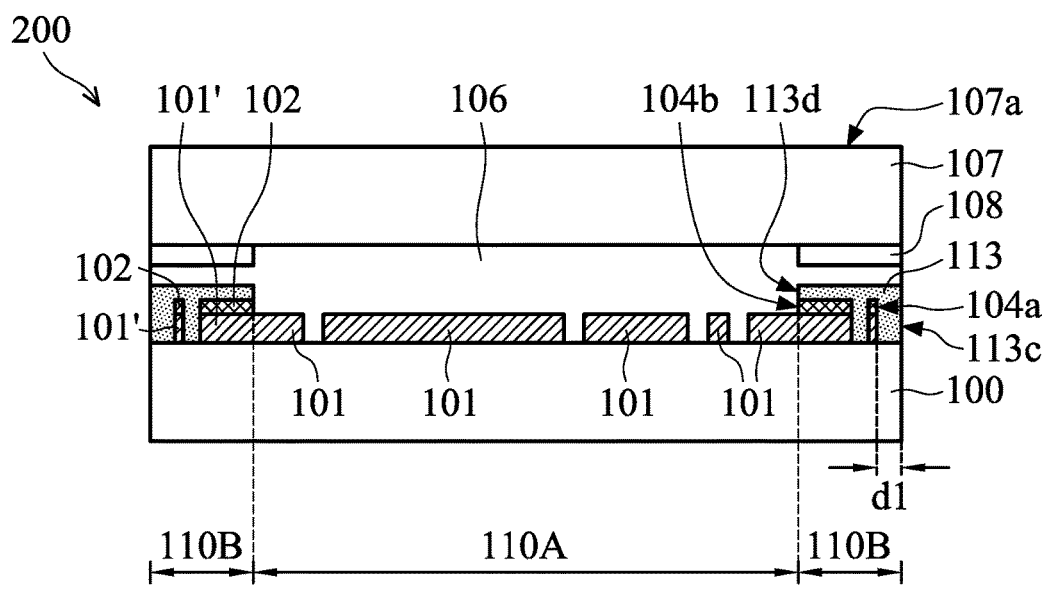
FIG. 4 shows a cross section of a touch panel, along line A-A' shown in FIG. 2J, according to some other embodiments of the disclosure.

FIG. 4 shows a cross section of a touch panel 200, along line A-A' shown in FIG. 2J, according to some other embodiments of the disclosure. Elements of the touch panel 200 in FIG. 4 that are the same as those in FIG. 1 are labeled with the same reference numbers as in FIG. 1 and are not described again for brevity.

The structure of the touch panel 200 shown in FIG. 4 is similar to that of the touch panel 200 shown in FIG. 1. The difference therebetween is that the touch panel 200 in FIG. 4 further includes a shielding layer 108 disposed on a surface of the cover plate 107 facing the substrate 100. An orthogonal projection of the shielding layer 108 on the substrate 100 is overlapped with the peripheral area 110B. In the embodiment, the protective layer 106 is also between the shielding layer 108 and the insulating layer 113. In the embodiment, the color of the shielding layer 108 may be white, gray or other opaque colors to decorate the exterior border color of the touch panel 200. In the embodiment, the shielding layer 108 includes an ink. But the disclosure is not limited to the above embodiments.

The embodiments of the disclosure use the insulating layer 113 having a light-shielding effect to cover the top surface and the first sidewall 104a of the metal layer 102 and cover the wiring portion 101', and thus the touch panel 200 of FIG. 4 may no need to form an additional light-shielding layer on the cover plate 107. In addition, even if the cover plate 107 of the touch panel 200 includes the shielding layer 108 having other opaque colors thereon, since the disposition of the insulating layer 113 can effectively decrease the thickness of the protective layer 106 between the cover plate 107 and the substrate 100, the touch panel 200 of FIG. 4 still has a relative thin total thickness.

The embodiments of the disclosure can be applied to some types of touch panel that is formed outside a display panel, for example but not limit to a glass-glass (GG) type touch panel, a glass-film (GF1) type touch panel, or a glass-film-film (GFF) type touch panel. The embodiments of the disclosure can also be applied to types of touch panel that is formed on a color filter (CF) substrate of a display panel, for example a touch-on display (TOD) typed touch panel, but it is not limited thereto.

FIGS. 2A-2J show plane views of various stages of a method of fabricating a touch panel 200 of FIG. 2J according to some embodiments of the disclosure. In FIG. 2A, a substrate 100 is provided (as shown in FIGS. 1, 3, and 4), and a transparent conductive layer 101" (for example, an indium tin oxide (ITO) film) is formed in the touch area 110A and the peripheral area 110B of the substrate 100 by a deposition process (for example, a physical vapor deposition process, a chemical vapor deposition process or another suitable process). Then, an annealing process is performed to the transparent conductive layer 101" such that the resistivity of the transparent conductive layer 101" is decreased. In some embodiments, the annealing process may be a rapid thermal annealing (RTA) process.

In FIG. 2B, a metal layer 102 is formed on the transparent conductive layer 101" by a deposition process (for example, a physical vapor deposition process, a chemical vapor deposition process or another suitable process), and the metal layer 102 is for example a copper layer. In some embodiments, the deposition process of forming the metal layer 102 may be a sputtering process. In FIG. 2C, a photoresist layer 103 is formed on the metal layer 102 by a dry film adhering process. In some other suitable processes, a traditional photoresist material is coated on the metal layer 102 to form the photoresist layer 103.

Refer to FIG. 2D. After a photolithography patterning process that includes photomask aligning, exposing, photoresist developing, washing and drying (for example, hard baking), or another suitable patterning process, or a combination thereof, the patterned photoresist layer 103' has a pattern of touch-sensing electrodes, a peripheral wiring layer, and pads of the touch panel 200, and expose the metal layer 102 not covered by the patterned photoresist layer 103'.

Refer to FIGS. 2D-2E. An etching process (for example, a dry-etching process, a wet-etching process, a plasma-etching process, a reactive ion etching process or another suitable process) is performed on the exposed metal layer 102 by using the patterned photoresist layer 103' as a mask and thus the transparent conductive layer 101" below the metal layer 102 is exposed, as shown in FIG. 2E.

Refer to FIGS. 2E-2F. An etching process (for example, a dry-etching process, a wet-etching process, a plasma-etching process, a reactive ion etching process or another suitable process) is performed on the transparent conductive layer 101" by using the patterned photoresist layer 103' as a mask and thus the substrate 100 below the transparent conductive layer 101" is exposed, as shown in FIG. 2F.

In FIG. 2G, a stripping process is performed to remove the patterned photoresist layer 103'. Through the processes of FIGS. 2A-2G, the metal layer 102 and pads 105 in the peripheral area 110B of the touch panel 200 are formed on the substrate 100. Namely, the metal layer 102 and the pads 105 are formed in the same step. The metal layer 102 is formed on the wiring portion 101'. In the embodiment, the pattern of the remaining transparent conductive layer 101" below the metal layer 102 located in the touch area 110A would become the touch-sensing portion 101 in the touch area 110A, and the transparent conductive layer 101" below the metal layer 102 located in the peripheral area 110B would become the wiring portion 101'in the peripheral area 110B. Namely, the material of the touch-sensing portion 101 is the same as that of the wiring portion 101'. In some embodiments, a first anti-oxidation treatment is performed on the metal layer 102 of FIG. 2G to protect the metal layer 102.

Refer to FIGS. 2H-2I. An insulating layer 113 is formed on the substrate 100 and covers the patterned transparent conductive layer 101" and the metal layer 102 through a dry-film photoresist adhering process. Then, a first patterning process is performed on the insulating layer 113 through a photolithography patterning process that includes photomask aligning, exposing, photoresist developing, washing and drying (for example, hard baking), or another suitable patterning process. A first opening 113a is formed in the insulating layer 113 by the first patterning process. The first opening 113a exposes a first portion 102a of the metal layer 102 and the substrate 100 in the touch area 110A. Moreover, the insulating layer 113 covers and defines the peripheral area 110B adjacent to the touch area 110A such that the substrate 100 is divided into the touch area 110A and the peripheral area 110B. In the meantime, the insulating layer 113 covers the top surface and the first sidewall 104a of the wiring layer 104 (as shown in FIG. 1). In some embodiments, the material of the insulating layer 113 is the same as that of the photoresist layer 103. In some other embodiments, the material of the insulating layer 113 is different from that of the photoresist layer 103.

An etching process (for example, a dry-etching process, a wet-etching process, a plasma-etching process, a reactive ion etching process or another suitable process) is performed on the metal layer 102 in the touch area 110A of FIG. 2I to remove the first portion 102a of the metal layer 102 located in the first opening 113a to expose a portion of the transparent conductive layer 101" below the first portion 102a. As a result, the touch-sensing portion 101 is formed on the substrate 100 in the touch area 110A. As shown in FIG. 2J, the metal layer 102 (depicted in FIG. 2G) below the insulating layer 113 is electrically connected to the touch-sensing layer 101. Then, a second patterning process is performed to the insulating layer 113 by a partial photoresist stripping process. A portion of the insulating layer 113 in the peripheral area 110B is removed by the second patterning process to form a second opening 113b in the insulating layer 113. As shown in FIG. 2J, the second opening 113b exposes a portion of the metal layer 102, i.e. a second portion 102b of the metal layer 102. In the embodiment, the exposed second portion 102b of the metal layer 102 is pads 105 (as shown in FIG. 2G) used for external electrical connection. In some embodiments, the partial photoresist stripping process includes coating a photoresist stripper solution on a specified portion of the insulating layer 113 by way of a screen printing or gravure printing, so that the photoresist stripper solution can remove the specified portion of the insulating layer 113. In some embodiments, after the step of performing the second patterning process on the insulating layer 113, a second anti-oxidation treatment is performed on the second portion 102b of the metal layer 102 to protect the touch-sensing portion 101.

In the embodiment, other elements (including an insulating layer (not shown), a bridge structure (not shown) and a protective layer (not shown)) of the touch panel 200 are formed in order on the touch-sensing portion 101 and the substrate 100 in the first opening 113a (i.e. in the touch area 110A) through a deposition process (for example, a physical vapor deposition process, a chemical vapor deposition process, or another suitable process). A flexible printed circuit board is electrically connected to the second portion 102b of the metal layer 102 that is used as pads, and the cover plate 107 (as shown in FIG. 1) is disposed to cover the touch-sensing portion 101 and the insulating layer 113.

Figure 5:
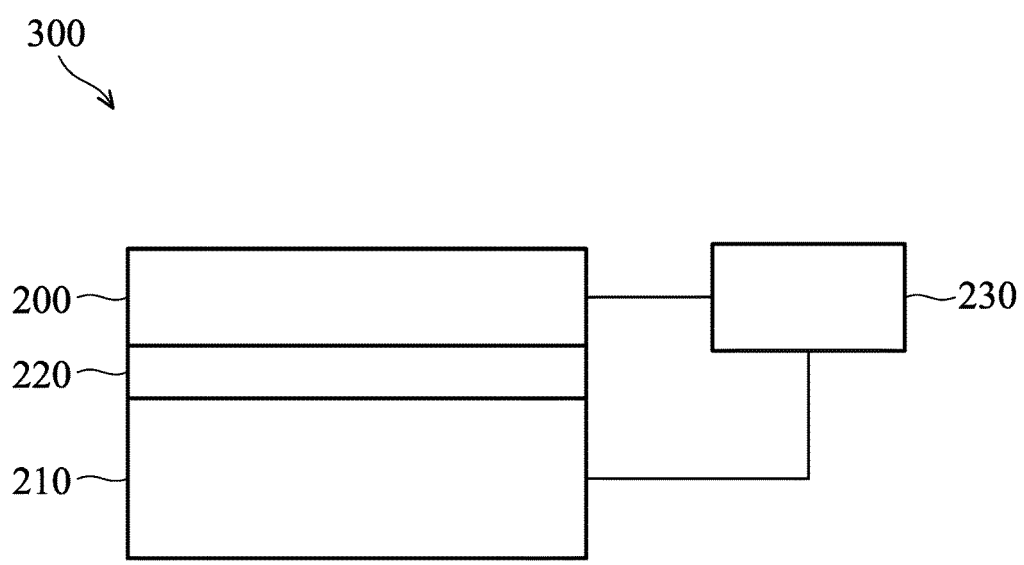
FIG. 5 shows a cross section of a touch display device according to some embodiments of the disclosure.

FIG. 5 shows a cross section of a touch display device 300 according to some embodiments of the disclosure. The touch display device 300 includes a thin-film transistor substrate 210, a display medium layer 220 disposed on the thin-film transistor substrate 210 and the touch panel 200 disposed on the display medium layer 220. In the embodiment, the substrate 100 of the touch panel faces the display medium layer 220. The touch display device 300 may be a liquid-crystal display (LCD), an organic light-emitting diode (OLED) display, a quantum dot display (QD), or an inorganic light-emitting diode display (Micro LED). Further, the touch display device 300 is a flat display device, a flexible display device, or a 3D-curve display device. Further, the shape of the touch display device 300 is not limited and may include circle, ellipse, polygon, or non-regular. In addition, generally, the touch display device 300 further includes a control unit 230. The control unit 230 is coupled to the touch panel 200 and the thin-film transistor substrate 210. The control unit 230 receives a first signal generated by the touch panel 200 and transmits a second signal corresponding to the first signal to the thin-film transistor substrate 210, thus the thin-film transistor substrate 210 displays an image according to an act of touching the touch panel 200. The above touch display device 300 may be a mobile phone, a digital camera, a personal digital assistant (PDA), a notebook, a desktop computer, a television, a car display or a portable DVD player.

According to some embodiments of the disclosure, through the insulating layer covering the top surface and the first sidewall of the metal layer, the third sidewall of the metal layer near the touch area can be substantially aligned with the fourth sidewall of the insulating layer near the touch area. Thus, the distance between the insulating layer and the innermost wire of the metal layer and the wiring portion is decreased. The peripheral area of the touch panel defined by the insulating layer having the light-shielding effect is thereby reduced. Therefore, the slim border design of the touch panel is achieved.

Or, since the insulating layer covers the metal layer and the wiring portion, the insulating layer can more effectively avoid moisture penetration and to protect the metal layer and the wiring portion of the touch panel. Therefore, the touch panels of the disclosure can pass a strict reliability test, and the lifetime of the touch panels is increased. Accordingly, in the design of the touch panels of the disclosure, the first distance between the first sidewall of the metal layer away from the touch area and the second sidewall of the insulating layer away from the touch area can be further decreased to achieve the slim border design of the touch panel.

Or, the metal layer is disposed on the wiring portion of the transparent conductive layer. Thus, even if the metal layer becomes oxidized, the wiring portion disposed under the metal layer 102 still has a conductive function. Therefore, the design of the configuration of the metal layer and the wiring portion can effectively reduce the risk of conductive function failure.

Or, through the insulating layer covering the top surface and the first sidewall of the metal layer and covering the wiring portion, the insulating layer can effectively protect the metal layer and the wiring portion in the manufacturing processes of the touch panels and protect the metal layer and the wiring portion from physical and chemical destruction during the manufacturing process. The yield of the touch panels is thereby enhanced.

While the disclosure has been described by way of example and in terms of the embodiments, it is to be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A touch panel, comprising:
a substrate having a touch area and a peripheral area adjacent to the touch area;
a transparent conductive layer disposed on the substrate, the transparent conductive layer includes a touch-sensing portion and a wiring portion, wherein the touch-sensing portion is electrically connected to the wiring portion, and wherein the touch-sensing portion is disposed corresponding to the touch area and the wiring portion is disposed corresponding to the peripheral area;
a metal layer disposed on the wiring portion of the transparent conductive layer and corresponding to the peripheral area; and
an insulating layer disposed on the metal layer and corresponding to the peripheral area.

2. The touch panel of claim 1, wherein the metal layer includes a first sidewall located away from the touch area, the insulating layer includes a second sidewall located away from the touch area, and a distance between the first sidewall and the second sidewall is 100 µm-200 µm.

3. The touch panel of claim 1, wherein the metal layer includes a third sidewall located near the touch area, the insulating layer includes a fourth sidewall located near the touch area, and a distance between the third sidewall and the fourth sidewall is 0 µm-10 µm.

4. The touch panel of claim 1, further comprising a protective layer disposed on the insulating layer and covering the touch area and the peripheral area.

5. The touch panel of claim 4, further comprising a cover plate disposed on the protective layer.

6. The touch panel of claim 5, further comprising a shielding layer disposed on a surface of the cover plate facing the substrate, wherein an orthogonal projection of the shielding layer on the substrate is overlapped with the peripheral area.

7. The touch panel of claim 1, wherein the insulating layer includes an opaque photoresist material.

8. The touch panel of claim 1, wherein an optical density of the insulating layer is 1.5-3.

9. The touch panel of claim 1, wherein the transparent conductive layer includes indium tin oxide (ITO), indium zinc oxide (IZO), indium zinc tin oxide (IZTO), fluorine doped tin oxide (FTO), aluminum doped zinc oxide (AZO), gallium doped zinc oxide (GZO), or indium gallium zinc oxide (IGZO).

10. The touch panel of claim 1, wherein the metal layer includes copper, aluminum, silver, gold, or molybdenum.

11. A touch display device, comprising:
a thin-film transistor substrate;
a display medium layer disposed on the thin-film transistor substrate;
a substrate disposed on the display medium layer having a touch area and a peripheral area adjacent to the touch area;
a transparent conductive layer disposed on the substrate, the transparent conductive layer includes a touch-sensing portion and a wiring portion, wherein the touch-sensing portion is electrically connected to the wiring portion, and wherein the touch-sensing portion is disposed corresponding to the touch area and the wiring portion is disposed corresponding to the peripheral area;
a metal layer disposed on the wiring portion of the transparent conductive layer and corresponding to the peripheral area; and
an insulating layer disposed on the metal layer and corresponding to the peripheral area.

12. The touch display device of claim 11, wherein the metal layer includes a first sidewall located away from the touch area, the insulating layer includes a second sidewall located away from the touch area, and a distance between the first sidewall and the second sidewall is 100 µm-200 µm.

13. The touch display device of claim 11, wherein the metal layer includes a third sidewall located near the touch area, the insulating layer includes a fourth sidewall located near the touch area, and a distance between the third sidewall and the fourth sidewall is 0 µm-10 µm.

14. The touch display device of claim 11, further comprising a protective layer disposed on the insulating layer and covering the touch area and the peripheral area.

15. The touch display device of claim 14, further comprising a cover plate disposed on the protective layer.

16. The touch display device of claim 15, further comprising a shielding layer disposed on a surface of the cover plate facing the substrate, wherein an orthogonal projection of the shielding layer on the substrate is overlapped with the peripheral area.

17. The touch display device of claim 11, wherein the insulating layer includes an opaque photoresist material.

18. The touch display device of claim 11, wherein an optical density of the insulating layer is 1.5-3.

19. The touch display device of claim 11, wherein the transparent conductive layer includes indium tin oxide (ITO), indium zinc oxide (IZO), indium zinc tin oxide (IZTO), fluorine doped tin oxide (FTO), aluminum doped zinc oxide (AZO), gallium doped zinc oxide (GZO), or indium gallium zinc oxide (IGZO).

20. The touch display device of claim 11, wherein the metal layer includes copper, aluminum, silver, gold, or molybdenum.

* * * * *